(12) United States Patent
Hartman et al.

(10) Patent No.: US 6,608,760 B2
(45) Date of Patent: Aug. 19, 2003

(54) DIELECTRIC MATERIAL INCLUDING PARTICULATE FILLER

(75) Inventors: William F. Hartman, Albuquerque, NM (US); Kirk M. Slenes, Albuquerque, NM (US); Kristen J. Law, Albuquerque, NM (US)

(73) Assignee: TPL, Inc., Albuquerque, NM (US)

( * ) Notice: Subject to any disclaimer, the term of this patent is extended or adjusted under 35 U.S.C. 154(b) by 0 days.

(21) Appl. No.: 09/458,363

(22) Filed: Dec. 9, 1999

(65) Prior Publication Data

US 2001/0036052 A1 Nov. 1, 2001

Related U.S. Application Data

(63) Continuation-in-part of application No. 09/305,253, filed on May 4, 1999.
(60) Provisional application No. 60/084,014, filed on May 4, 1998.

(51) Int. Cl.$^7$ .................................................. H05K 1/16
(52) U.S. Cl. ........................................ 361/762; 361/763
(58) Field of Search ...................... 523/457; 156/307.3; 361/762, 763

(56) References Cited

U.S. PATENT DOCUMENTS

| | | | |
|---|---|---|---|
| 3,290,756 A | 12/1966 | Dreyer | |
| 3,304,475 A | 2/1967 | Gowen et al. | |
| 3,593,107 A | 7/1971 | Chilton et al. | |
| 3,673,092 A | 6/1972 | Dietz | |
| 4,000,054 A | 12/1976 | Marcantonio | |
| 4,087,300 A | 5/1978 | Adler | |
| 4,294,009 A | 10/1981 | Quintin et al. | |
| 4,306,273 A | 12/1981 | Maylandt et al. | |
| 4,490,429 A | 12/1984 | Tosaki et al. | |
| 4,520,004 A | 5/1985 | Uedaira et al. | |
| 4,558,020 A | 12/1985 | Itakura et al. | |
| 4,764,493 A | * 8/1988 | Lilley et al. ................. | 501/137 |
| 4,775,573 A | 10/1988 | Turek | |
| 4,816,072 A | 3/1989 | Harley et al. | |
| 4,827,377 A | 5/1989 | Butt | |
| 4,829,033 A | 5/1989 | Menashi et al. | |
| 4,832,939 A | 5/1989 | Menashi et al. | |
| 4,859,448 A | 8/1989 | Klee et al. | |
| 4,863,883 A | 9/1989 | Menashi et al. | |
| 4,882,455 A | 11/1989 | Sato et al. | |
| 4,908,258 A | 3/1990 | Hernandez | |
| 4,942,079 A | 7/1990 | Kumagai et al. | |
| 4,943,469 A | 7/1990 | Kumagai et al. | |
| 4,943,606 A | 7/1990 | Inoue et al. | |
| 4,952,538 A | 8/1990 | Kumagai et al. | |
| 4,987,108 A | 1/1991 | Takagi et al. | |
| 4,999,740 A | 3/1991 | Ilardi et al. | |
| 5,010,641 A | 4/1991 | Sisler | |
| 5,079,069 A | 1/1992 | Howard et al. | |
| 5,112,433 A | 5/1992 | Dawson et al. | |
| 5,155,655 A | 10/1992 | Howard et al. | |
| 5,161,086 A | 11/1992 | Howard et al. | |
| 5,162,977 A | * 11/1992 | Paurus et al. ................ | 361/401 |
| 5,172,304 A | * 12/1992 | Ozawa et al. ................ | 361/401 |
| 5,256,470 A | 10/1993 | Jean et al. | |
| 5,261,153 A | 11/1993 | Lucas | |
| 5,428,499 A | 6/1995 | Szerlip et al. | |
| 5,445,806 A | 8/1995 | Kinugasa et al. | |
| 5,451,426 A | 9/1995 | Abe et al. | |
| RE35,064 E | 10/1995 | Hernandez | |
| 5,469,324 A | 11/1995 | Henderson et al. | |
| 5,504,993 A | 4/1996 | Szerlip et al. | |
| 5,555,486 A | 9/1996 | Kingon et al. | |
| 5,569,488 A | 10/1996 | Frankosky | |
| 5,604,018 A | 2/1997 | Horiuchi et al. | |
| 5,638,252 A | 6/1997 | Drab et al. | |
| 5,796,587 A | * 8/1998 | Lauffer et al. ............... | 361/763 |
| 5,800,575 A | 9/1998 | Lucas | |
| 5,870,274 A | 2/1999 | Lucas | |
| 5,926,377 A | 7/1999 | Nakao et al. | |
| 5,972,231 A | 10/1999 | DiBene, II | |
| 5,973,929 A | 10/1999 | Arakawa et al. | |

OTHER PUBLICATIONS

Uchino, Kenji, et al, "Particle/Grain Size Dependence of Ferroelectricity", *Ceramic Dielectrics,* 1989, pp. 107–115 (copy already attached to amendent).

* cited by examiner

*Primary Examiner*—Michael W. Ball
*Assistant Examiner*—John T. Haran
(74) *Attorney, Agent, or Firm*—Deborah A. Peacock; Rod D. Baker; Katy C. Fain

(57) ABSTRACT

A dielectric substrate useful in the manufacture of printed wiring boards is disclosed wherein the dielectric substrate comprises at least one organic polymer having a $T_g$ greater than 140° C. and at least one filler material. The dielectric substrate of this invention has a dielectric constant that varies less than 15% over a temperature range of from −55 to 125° C.

18 Claims, 3 Drawing Sheets

DIELECTRIC MATERIAL INCLUDING PARTICULATE FILLER

This application is a continuation-in-part application of U.S. patent application Ser. No. 09/305,253, entitled "Integral Capacitance for Printed Circuit Board Using Dielectric Nanopowders", of William F. Hartman, Kirk M. Slenes, and Kristen J. Law, filed on May 4, 1999, which claims the benefit of the filing of U.S. Provisional Patent Application Ser. No. 60/084,104, entitled "Integral Capacitance for Printed Circuit Board Using Dielectric Nanopowders", filed on May 4, 1998, and the specifications thereof are incorporated herein by reference.

BACKGROUND OF THE INVENTION

1. Field of the Invention (Technical Field)

The present invention relates to a dielectric substrate useful in the manufacture of printed wiring boards wherein the dielectric substrate comprises at least one organic polymer having a $T_g$ greater than 140° C. and at least one filler material. The dielectric substrate of this invention has a dielectric constant that varies less than 15% over a temperature range of from −55 to 125° C. This invention also includes multilayer printed circuit boards including dielectric substrates of this invention and especially printed circuit boards wherein the dielectric substrate of this invention is used to form internal distributed capacitors in the printed circuit board.

2. Background Art

Multilayer printed wiring boards (PWB's) are widely used in electronic devices such as computers, telephones, appliances, automobiles and the like. Multilayer printed wiring boards typically include a board having a plurality of insulated conductive trace layers separated by dielectric substrate layers. Due to the demand for smaller and smaller electronic devices, efforts have been made to incorporate circuit devices directly into printed wiring boards. For example, U.S. Pat. No. 5,010,641 discloses a multilayer printed wiring board including internal distributed capacitors. Similarly, U.S. Pat. Nos. 5,155,655 and 5,161,060 disclose capacitor laminates useful in the manufacture of capacitive printed wiring boards.

The capacitors built into printed wiring boards typically include a metal ground layer and a charged metal layer divided by a dielectric substrate layer. The dielectric layers used in printed wiring board capacitors are generally polymeric sheets that may be reinforced with materials such as glass, ceramics and so forth. More recently, there has been a trend towards reducing the profile of circuits and dielectric layers in printed wiring boards in order to increase printed wiring board circuit density. This trend has resulted in the reduction of the thickness of dielectric layers associated with wiring board capacitors. However, a problem with reducing the thickness of capacitor dielectric layers is that the dielectric constant of the dielectric layer varies too widely with varying temperatures causing undesirable variable capacitance. Therefore, there remains the need for dielectric substrate layers that are useful in forming printed wiring board capacitors that are thin and have dielectric constants that vary little over a wide temperature range.

SUMMARY OF THE INVENTION (DISCLOSURE OF THE INVENTION)

A primary object of the present invention is to provide a dielectric substrate that has a dielectric constant that varies little over a wide temperature range.

Another primary object of the present invention is to provide a dielectric layer that includes a non-sintered particular material.

Another primary object of the present invention is to provide a capacitor laminate including a dielectric sheet having an essentially unchanging dielectric constant which is located between conductive foil layers.

A primary advantage of the present invention is a composite comprising at least one organic polymer having a $T_g$ greater than about 140° C., and at least one ferroelectric particle filler. The organic polymer and ferroelectric particles are chosen to produce a composite having a dielectric constant that varies less than 15% when the composite is subjected to temperatures ranging from −55 to 125° C.

Another primary advantage of the present invention is a capacitor laminate comprising a composite of this invention formed into a sheet and having a top surface and a bottom surface. The capacitor laminate includes a first conductive layer associated with the composite top surface, and a second conductive layer associated with the composite bottom surface.

Another primary advantage of the present invention includes multi-layer printed wiring boards wherein at least one layer comprises a capacitor laminate of this invention.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

Figure 1:
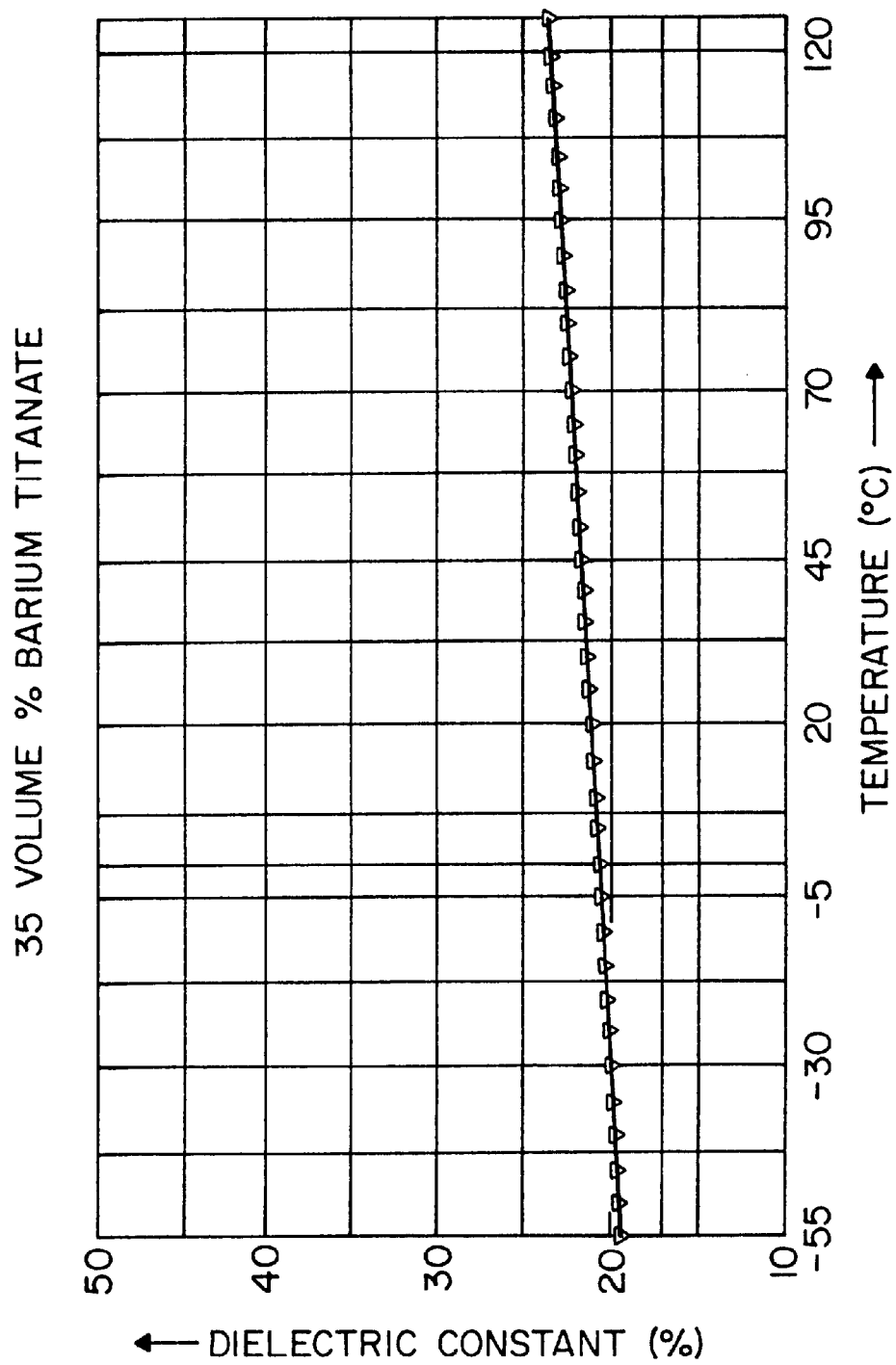
FIG. 1 is a plot showing the effect of temperatures ranging from −55 to 125° C. on the measure dielectric constant of composites prepared according to Example 1.
Figure 2:
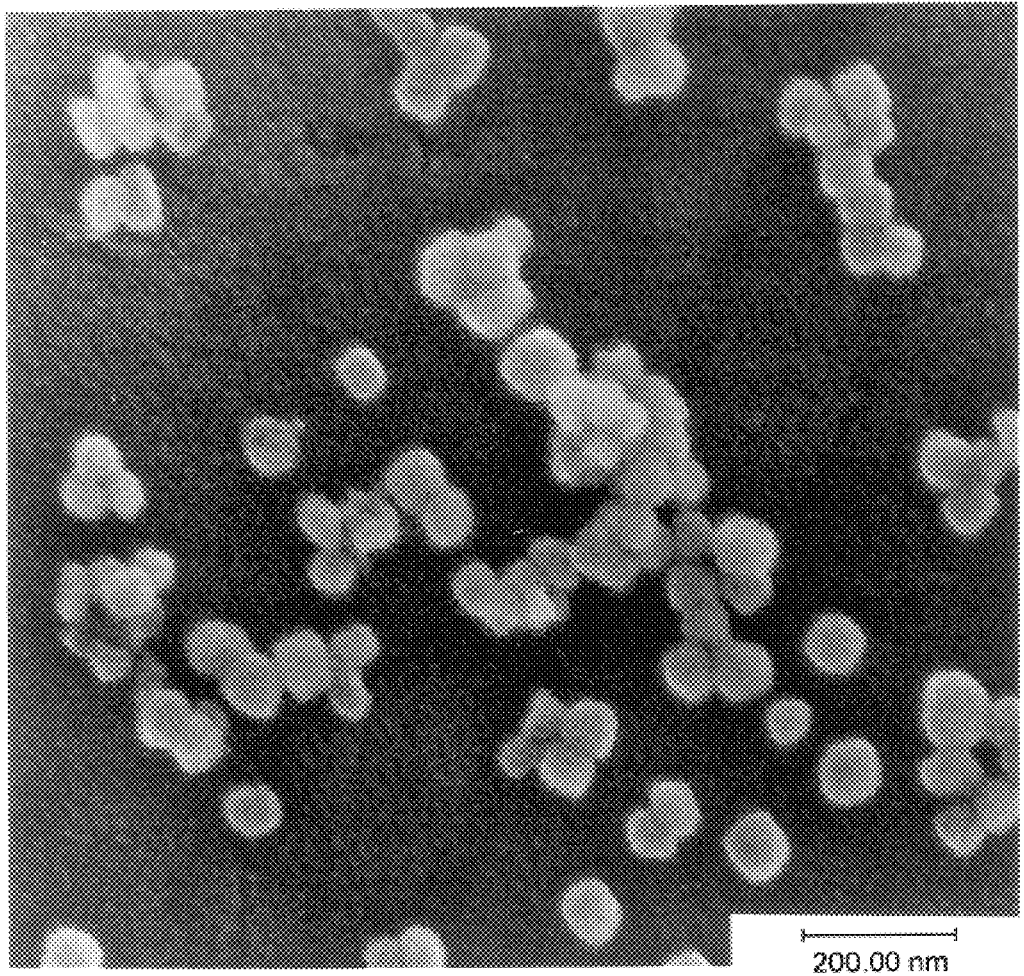
FIG. 2 is an electron micrograph depicting barium titanate particles manufactured by a non-refractory method and having a uniform particle size of approximately 50 nm.
Figure 3:
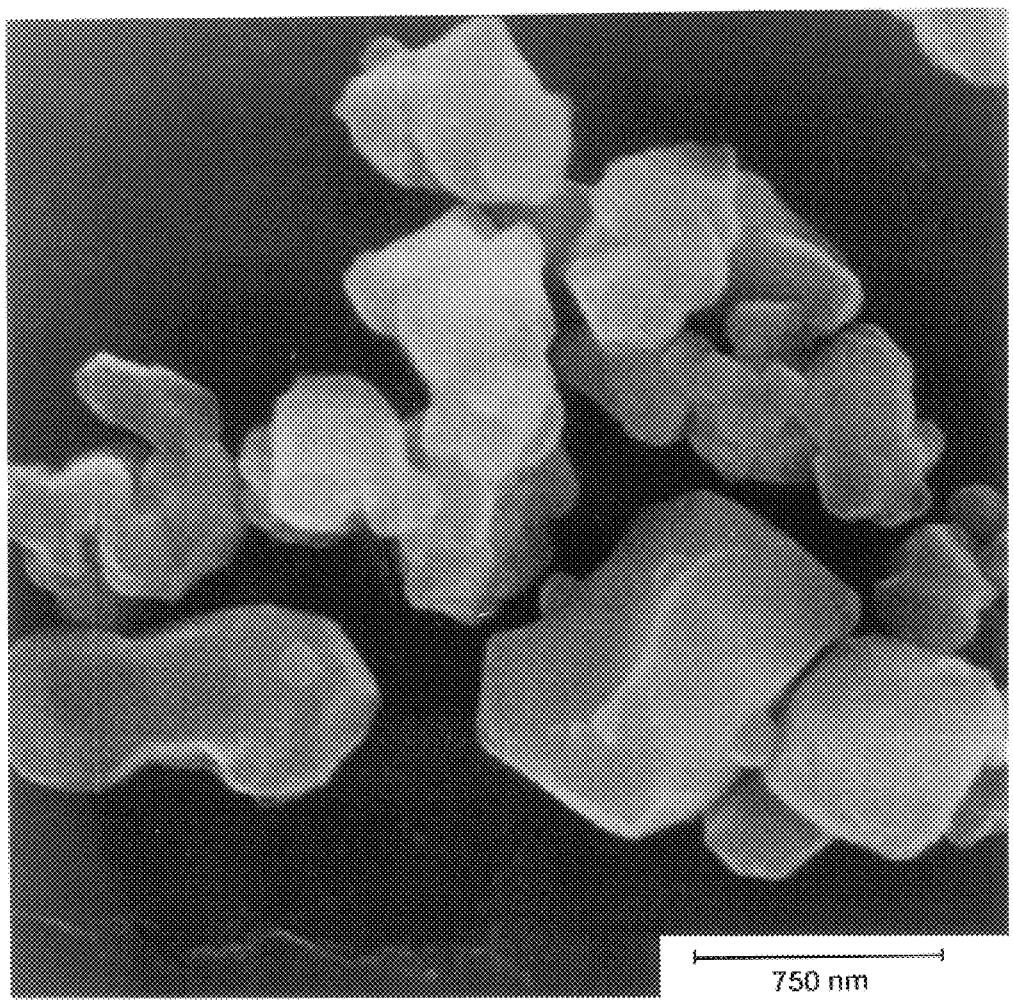
FIG. 3 is an electron micrograph of milled barium titanate particles that were prepared by a refractory process.

DESCRIPTION OF THE PREFERRED EMBODIMENTS BEST MODES FOR CARRYING OUT THE INVENTION

The present invention relates to the dielectric substrate materials comprising at least one organic polymer and at least one filler wherein the dielectric constant of the laminate varies less than 15% when the composite is subjected to temperatures ranging from −55 to 125° C. The present invention includes capacitor laminates and multilayer printed circuit boards including capacitor laminates prepared from the dielectric substrate materials of this invention.

The capacitance of the dielectric layer varies depending upon factors such as the layer dielectric constant, thickness and area according to the following equation:

$$C_p/A = \epsilon/\tau$$

Because the area (A) is generally constant, the only way to vary capacitance, $C_p$, is to vary the substrate dielectric constant (C) or thickness ($\tau$). Furthermore since decreasing the thickness ($\tau$) of the laminate becomes difficult below about 1 mil, it becomes important to control capacitance by choosing a dielectric substrate composition with the desired dielectric constant.

A further complicating factor is that the substrate dielectric constant ($\epsilon$), and thus $C_p$, can vary significantly over a range of temperatures. Dielectric substrates are considered to have performance or "X7R" performance when the dielectric constant changes ±15% over the 180° C. temperature range of from −55 to 125° C. An important aspect of this invention is our discovery that the dielectric substrates that include non-refractory ferroelectric particles exhibit a high and vary stable dielectric constant over wide ranging temperatures.

The term "non-refractory ferroelectric particles" is used herein to refer to particles made from one or more ferroelectric materials. Preferred ferroelectric materials include barium titanate, strontium titanate, barium neodymium titanate, barium strontium titanate, magnesium zirconate, titanium dioxide, calcium titanate, barium magnesium titanate, lead zirconium titanium and mixtures thereof.

The ferroelectric particles useful in the present invention may have particle size ranging from about 20 to about 150 nanometers and have a cubic crystalline structure. It is preferred that the particles are essentially all nanoparticles which means that the particles have a particle size of less than 100 nanometers and preferably a particle size of about 50 nanometers. It Is also preferred that at least 50% of the ferroelectric particles have a size ranging from 50 to 100 nanometers and preferably from 40–60 nanometers.

The ferroelectric particles useful in this invention are preferably manufactured by a non-refractory process such as a precipitation process. Most preferred non-refractory particles are 50 nanometer barium or strontium titanate nanoparticles manufactured by TPL, Inc. What is not included within the scope of non-refractory ferroelectric particles are those particles that are produced by a heating or sintering process.

The ferroelectric particles are combined with at least one polymer to form dielectric layers. The ferroelectric particles may be present in the dielectric layer in an amount ranging from about 10 to about 60 vol % and preferably from about 15 to 50 vol % and most preferably from about 20 to 40 vol % of the dielectric layer with the remainder of the dielectric layer comprising one or more resin systems.

The ferroelectric particles are preferably combined with one or more resins that are commonly used to manufacture dielectric printed circuit board layers. The resins may include material such as silicone resins, cyanate ester resins, epoxy resins, polyamide resins, Kapton material, bismaleimide triazine resins, urethane resins, mixtures of resins and any other resins that are useful in manufacturing dielectric substrate materials. The resin is preferably a high $T_g$ resin. By high $T_g$, it is meant that the resin system used should have a cured $T_g$ greater than about 140° C. It is more preferred that the resin $T_g$ be in excess of 160° C. and most preferably in excess of 180° C. A preferred resin system is 406-N Resin manufactured by AlliedSignal Inc.

The dielectric layers of this invention are manufactured by combining the appropriate amount of ferroelectric particles with the desired resin. The resin/ferroelectric particle resin mixture is then coated onto a conductive metal layer. The ferroelectric particle containing resin is then dried to remove solvent from the resin.

The dielectric substrates of this invention are useful for manufacturing capacitor laminates. The capacitor laminate of this invention includes a dielectric layer described above comprising ferroelectric particles, a first conductive metal layer associated with the dielectric layer top surface and a second conductive metal layer associated with the dielectric layer bottom surface. Capacitor laminates may be manufactured by any methods that are known in the art, for example, the U.S. Pat. No. 5,155,655, which is incorporated herein by reference. In another method, capacitor laminates having a top conductive metal surface and a bottom conductive metal surface separated by a ferroelectric particle-containing resin are manufactured by: (i) applying ferroelectric particle-containing resin mixture to the surface of a conductive metal foil; and (ii) applying a second layer of the conductive metal to the exposed resin to sandwich the ferroelectric particle containing resin between the conductive metal layers. Alternatively, a second ferroelectric particle/resin coated conductive metal can be applied to the first ferroelectric particle-containing resin coated conductive metal to create a sandwich wherein the ferroelectric particle-containing resin is located between the two conductive metal layers. Once formed, the capacitor precursor is laminated at appropriate temperatures and pressures in order to cure the ferroelectric particle-containing resin. The curing temperatures and pressures will range from about 250 to about 350° and the pressures will vary from about 100 to about 1500 psi.

Conductive metal layers may be applied to the top surface and bottom surface of the dielectric substrate sheet by spurting, by electrodeposition or by adhering a conductive metal film or foil to a dielectric sheet top surface and bottom surface. In order to ensure adhesion between the conductive layer and the dielectric layer, the surface of the conductive metal or surface of the dielectric layer may be modified or roughened to improve adhesion of the metal layer to the top and bottom surfaces of the dielectric layer. The first and second conductive layers will typically have a thickness ranging from 9 to about 105 microns. It is preferred that the first and second conductive metal layers are copper foil layers having a thickness of from 17 to about 70 microns and most preferably a thickness of about 35 microns. It is preferred that the conductive metal layers used in the capacitor dielectric are copper foil layers. Most preferably, both conductive metal layers will be double treated copper foil layers manufactured by Oak Mitsui, Gould or Circuit Foils.

The dielectric layer may include an optional second filler material in order to impart strength to the dielectric layer. Examples of the second filler materials include woven or non-woven materials such as quartz, silica glass, electronic grade glass and ceramic and polymers such as aramids, liquid crystal polymers, aromatic polyamides, or polyesters, particulate materials such as ceramic polymers, and other fillers and reinforcing material that are commonly used to manufacture printed wiring board substrate. The optional second filler material my be present in the dielectric layer in an amount ranging from about 20 to 70 wt % and preferably from an amount ranging from about 35 to about 65 wt %.

The dielectric materials of this invention may include other optional ingredients that are commonly used in the manufacture of dielectric layers. For example, the dielectric particles and/or the second filler material can include a binding agent to include the bond between the filler and the resin material in order to strengthen the dielectric layer. In addition, the resin compositions useful in this invention may include coupling agents such as silane coupling agents, zirconates and titanates. In addition, the resin composition useful in this invention may include surfactants and wetting agents to control particle agglomeration or coated surface appearance.

The compositions of this invention may be made into various articles. For instance, the composites may be shaped into films, sheets, plaques, disks and other flat shapes which are particularly useful as substrates in electronics such as printed wiring boards. The composites may also be manufactured into three dimensional shapes. The composites may be shaped by any methods known in the art such as extrusion, injection molding and compression molding, The dielectric layers manufactured using the resin/ferroelectric particle of this invention will have a thickness of from about 5 to about 60 microns. At these thicknesses the layers will have a capacitance from about 2100 to about 25000 pF/in$^2$. Preferred dielectric layers will have a thickness ranging from about 20 to about 40 microns and the capacitance from about 3100 to about 6300 pF/in$^2$ based upon a standard area.

An important property of the capacitor laminates of this invention is the breakdown voltage. The capacitor laminates of this invention have an extremely high breakdown voltage in comparison to filled and non-filled capacitor laminates of the prior art. It is preferred that the capacitor laminates of this invention have a breakdown voltage that exceeds 2000 volts/mil and preferably that exceeds 2500 volts/mil.

The capacitor laminates manufactured using the dielectric materials of this invention can be stacked and interconnected so that multiple layers are present in the printed wiring board, The layers may have different dielectric constants, different capacitance values and different thicknesses to form substrates for high density electronic packages such as single chip and multi-chip modules.

EXAMPLE 1

Dielectric substrates with varying resin $T_g$ and varying filler compositions were prepared and tested in this Example. Specifically, the substrates included no filler, sintered and ground barium titanate filler particles, and non-refractory barium titanate filler particles.

AlliedSignal 406 Resin was used alone or combined with 50 wt % barium titanate particles to form a dielectric layer. Two forms of barium titanate particles were used; sintered barium titanate particles manufactured by TAM Ceramics, Inc., Niagara Falls, N.Y., and nonrefractory barium titanate particles manufactured by TPL, Inc., in Albuquerque, N. Mex. The sintered barium titanate particles have a primary particle size of 1 micrometer, a BET surface area of 3.3 m$^2$/g and a dielectric constant of 3000. The nonrefractory barium strontium titanate particles had a particle size of about 0.05 micrometers, a BET surface area of 26.0 m$^2$/g and dielectric constant of 3000.

Dielectric layers were prepared using the resin or resin/particle combination by coating a 1 oz. Double Treat (DT) copper foil manufactured by Oak Mitsui with resin/particle combination, applying a second layer of 1 oz. copper foil to sandwich the resin/particle combination between the two copper foil layers and laminating the product for about one hour at 350° F. under a pressure from 300 to 1200 psi.

Each of the three capacitors was evaluated by measuring the dielectric constant of the substrate material over a temperature range from −55° C. to 125° C. The unfilled resin exhibited a 25% change in the dielectric constant over the testing temperature range. The composite including 50 wt % sintered barium titanate particles saw a 24.2% change in the dielectric constant over the tested temperature range while the composite including 50 wt % nonrefractory barium titanate saw its dielectric constant change only 10% over the tested temperature range.

EXAMPLE 2

A dielectric material including 35 vol. % nonrefractory barium titanate was prepared and tested according to the method of Example 1. The change in dielectric constant over a temperature range from −55° to 125° C. was plotted and is reported in FIG. 1. From FIG. 1, it is clear that the dielectric constant changes about 10% over the temperature range. Therefore, the amount of nonrefractory barium titanate in the composition does not dramatically alter the dielectric constant stability of the resulting dielectric composition.

EXAMPLE 3

A capacitor laminate including 35 vol. % nonrefractory barium titanate was prepared and tested according to the method of Example 1. However, the resin system used was AlliedSignal 402 Resin which has a $T_g$ of 140° C. The change in dielectric constant over a temperature range of −55 to 125° C. was 27.5%.

The preceding examples can be repeated with similar success by substituting the generically or specifically described reactants and/or operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A composite comprising at least one organic polymer having a $T_g$ greater than about 140° C., and at least one particle filler comprising non-refractory ferroelectric particles, said ferroelectric particles having a cubic crystalline structure, wherein the particle size is substantially in the range of between approximately 20 and 150 nanometers, and the dielectric constant of the composite varies less than 15% when the composite is subjected to a temperature of from −55 to 125° C.

2. The composite of claim 1 wherein the particles are barium-based ceramic particles.

3. The composite of claim 1 wherein the particles are selected from the group consisting of barium titanate, strontium titanate, and mixtures thereof.

4. The composite of claim 1 wherein the particles have an average particle size of from about 10 nm to about 60 nm.

5. The composite of claim 1 wherein at least 80% of the particles of the particle filler material have mean particle sizes ranging from about 40 micrometers to about 60 micrometers.

6. The composite of claim 1 including from about 20 to about 80 percent by weight ferroelectric particles.

7. The composite of claim 1 wherein the composite has a $T_g$ greater than about 160° C.

8. The composite of claim 1 wherein the composite has a $T_g$ greater than about 180° C.

9. The composite of claim 1 wherein at least one polymer is a thermosetting resin.

10. The composite of claim 9 wherein the resin is a thermosetting resin selected from the group consisting of epoxy resins, cyanate ester resins, silicone resins, polyamide resins, bismaleimide triazine resins, urethane resins, and mixtures thereof.

11. The composite of claim 1 wherein the composition breakdown voltage is greater than 2000 volts/mil.

12. A capacitor laminate comprising the composite of claim 1 in sheet form having a top surface and a bottom surface, a first conductive layer associated with the composite top surface, and a second conductive layer associated with the composite bottom surface.

13. The capacitor laminate of claim 12 wherein the first and second conductive layers are metal foil layers.

14. The capacitor laminate of claim 12 wherein the first and second conductive layers are copper foil layers.

15. The capacitor laminate of claim 12 wherein the composite sheet has a thickness of from about 1 to about 100 microns.

16. The capacitor laminate of claim 12 wherein at least one of said first conductive layers and second conductive layers is a sputtered metal layer.

17. The capacitor laminate of claim 12 wherein the breakdown voltage exceeds 2500 volts/mil.

18. A multi-layer printed wiring board wherein at least one layer comprises the capacitor laminate of claim 12.

* * * * *

UNITED STATES PATENT AND TRADEMARK OFFICE
CERTIFICATE OF CORRECTION

PATENT NO. : 6,608,760 B2
DATED : August 19, 2003
INVENTOR(S) : William F. Hartman et al.

It is certified that error appears in the above-identified patent and that said Letters Patent is hereby corrected as shown below:

<u>Column 1,</u>
Line 13, after the "CROSS-REFERENCE TO RELATED APPLICATION" and before the "BACKGROUND OF THE INVENTION" insert:

-- GOVERNMENT RIGHTS
The U.S. Government has a paid-up license in this invention and the right in limited circumstances to require the patent owner to license others on reasonable terms as provided for by the terms of Contract No. DTRA01-99-C-0181 awarded by the Defense Thread Reduction Agency. --

Signed and Sealed this

Second Day of March, 2004

JON W. DUDAS
*Acting Director of the United States Patent and Trademark Office*